US010727042B2

(12) United States Patent
Nakamori et al.

(10) Patent No.: US 10,727,042 B2
(45) Date of Patent: Jul. 28, 2020

(54) LIQUID PROCESSING METHOD, SUBSTRATE PROCESSING APPARATUS AND RECORDING MEDIUM

(71) Applicant: Tokyo Electron Limited, Tokyo (JP)

(72) Inventors: Mitsunori Nakamori, Koshi (JP); Yosuke Kawabuchi, Koshi (JP); Takuro Masuzumi, Koshi (JP); Koji Yamashita, Koshi (JP); Shozou Maeda, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 239 days.

(21) Appl. No.: 15/668,827

(22) Filed: Aug. 4, 2017

(65) Prior Publication Data
US 2018/0040471 A1 Feb. 8, 2018

(30) Foreign Application Priority Data

Aug. 8, 2016 (JP) .................................. 2016-155701

(51) Int. Cl.
H01L 21/02 (2006.01)
B29C 64/236 (2017.01)
B08B 3/10 (2006.01)
H01L 21/67 (2006.01)
H01L 21/687 (2006.01)
B33Y 30/00 (2015.01)
B33Y 50/02 (2015.01)
B41J 2/01 (2006.01)

(52) U.S. Cl.
CPC .......... *H01L 21/02041* (2013.01); *B08B 3/10* (2013.01); *B29C 64/236* (2017.08); *H01L 21/02052* (2013.01); *H01L 21/67051* (2013.01); *H01L 21/68764* (2013.01); *B29K 2995/0021* (2013.01); *B33Y 30/00* (2014.12); *B33Y 50/02* (2014.12); *B41J 2/01* (2013.01)

(58) Field of Classification Search
CPC combination set(s) only.
See application file for complete search history.

(56) References Cited

U.S. PATENT DOCUMENTS

2008/0142054 A1* 6/2008 Eitoku ............. H01L 21/67051
134/30
2012/0080061 A1* 4/2012 Kim ........................ F26B 5/005
134/95.2
2015/0090297 A1* 4/2015 Matsushita ....... H01L 21/67028
134/19

FOREIGN PATENT DOCUMENTS

JP 2007-036180 A 2/2007

* cited by examiner

*Primary Examiner* — Erin F Bergner
(74) *Attorney, Agent, or Firm* — Pearne & Gordon LLP

(57) ABSTRACT

A liquid processing method can remove pure water existing within a pattern of a substrate and replace the pure water with a solvent rapidly. The liquid processing method of supplying the pure water onto the substrate, which is horizontally held and has the pattern formed on a surface thereof, and drying the substrate includes a pure water supplying process of supplying the pure water onto the surface of the substrate; a heated solvent supplying process of supplying, after the pure water supplying process, the solvent in a liquid state, which is heated to a temperature equal to or higher than a boiling point of water, onto the surface of the substrate on which the pure water exists; and a removing process of drying the substrate by removing the solvent form the surface of the substrate.

9 Claims, 9 Drawing Sheets

LIQUID PROCESSING METHOD, SUBSTRATE PROCESSING APPARATUS AND RECORDING MEDIUM

CROSS-REFERENCE TO RELATED APPLICATION

This application claims the benefit of Japanese Patent Application No. 2016-155701 filed on Aug. 8, 2016, the entire disclosures of which are incorporated herein by reference.

TECHNICAL FIELD

The embodiments described herein pertain generally to a liquid processing method of performing a liquid processing by supplying pure water onto a substrate.

BACKGROUND

In a single-wafer type spin cleaning apparatus configured to perform a liquid processing on a semiconductor wafer (hereinafter, simply referred to as "wafer") as a substrate, an alkaline chemical liquid or an acidic chemical liquid is supplied onto a surface of the wafer being rotated to remove a dust, a native oxide, or the like on the surface of the wafer. The chemical liquid remaining on the surface of the wafer is removed by a rinse liquid such as pure water. Then, after the rinse liquid is replaced with a solvent (for example, IPA) having higher volatility than the pure water, the solvent is removed, so that the wafer is dried (see, for example, Patent Document 1). However, there is still a room for improvement in that a time taken to replace the rinse liquid with the solvent can be further reduced.

Patent Document 1: Japanese Patent Laid-open Publication No. 2007-036180: paragraphs [0039] and [0040]

SUMMARY

In view of the foregoing, exemplary embodiments provide a liquid processing method and a substrate processing apparatus capable of replacing pure water existing within a pattern of a substrate with a solvent rapidly, and a recording medium therefor.

In an exemplary embodiment, there is provided a liquid processing method of supplying pure water onto a substrate, which is horizontally held and has a pattern formed on a surface thereof, and drying the substrate. The liquid processing method includes a pure water supplying process of supplying the pure water onto the surface of the substrate; a heated solvent supplying process of supplying, after the pure water supplying process, a solvent in a liquid state, which is heated to a temperature equal to or higher than a boiling point of water, onto the surface of the substrate on which the pure water exists; and a removing process of drying the substrate by removing the solvent form the surface of the substrate.

According to the exemplary embodiment, by supplying the solvent in the liquid state, which is heated to the temperature equal to or higher than the boiling point of water, onto the surface of the substrate on which the pure water is previously supplied, the pure water existing within the pattern of the substrate can be rapidly replaced by the solvent.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
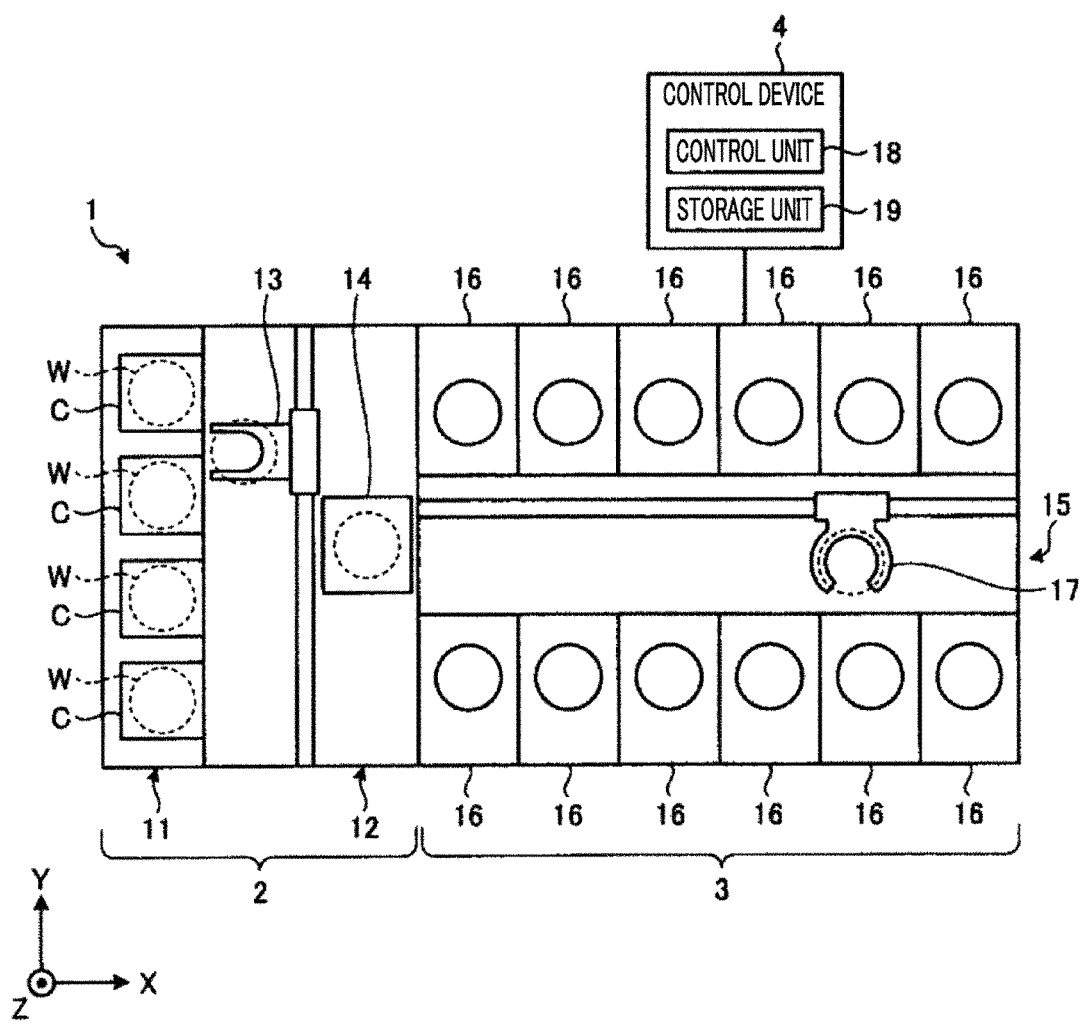
FIG. 1 is a plan view illustrating an outline of a substrate processing system equipped with a processing unit according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, an exemplary embodiment of the present disclosure will be explained in detail with reference to the accompanying drawings.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the substrate processing system 1. The control unit 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
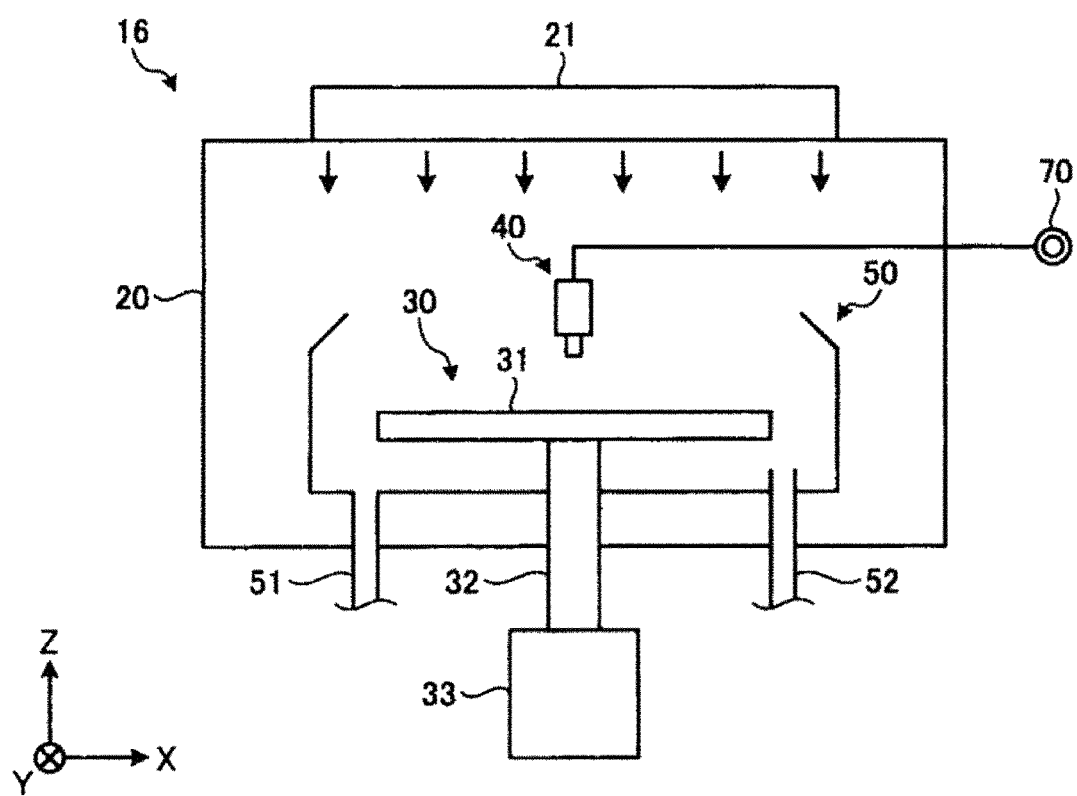
FIG. 2 is a longitudinal side view illustrating an outline of the processing unit.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

The processing unit 16 provided in the above-described substrate processing system 1 corresponds to a substrate processing apparatus configured to perform a liquid processing method according to an exemplary embodiment. Hereinafter, a configuration of the processing unit 16 will be explained with reference to FIG. 3.

The aforementioned processing fluid supply unit 40 in the processing unit 16 of the present exemplary embodiment is equipped with a chemical liquid nozzle 412 for supplying a chemical liquid and DIW (Deionized Water); and a HFO nozzle 413 for supplying HFO (hydrofluoroolefin) as a solvent onto the wafer W held by the substrate holding mechanism (substrate holding unit) 30.

Figure 3:
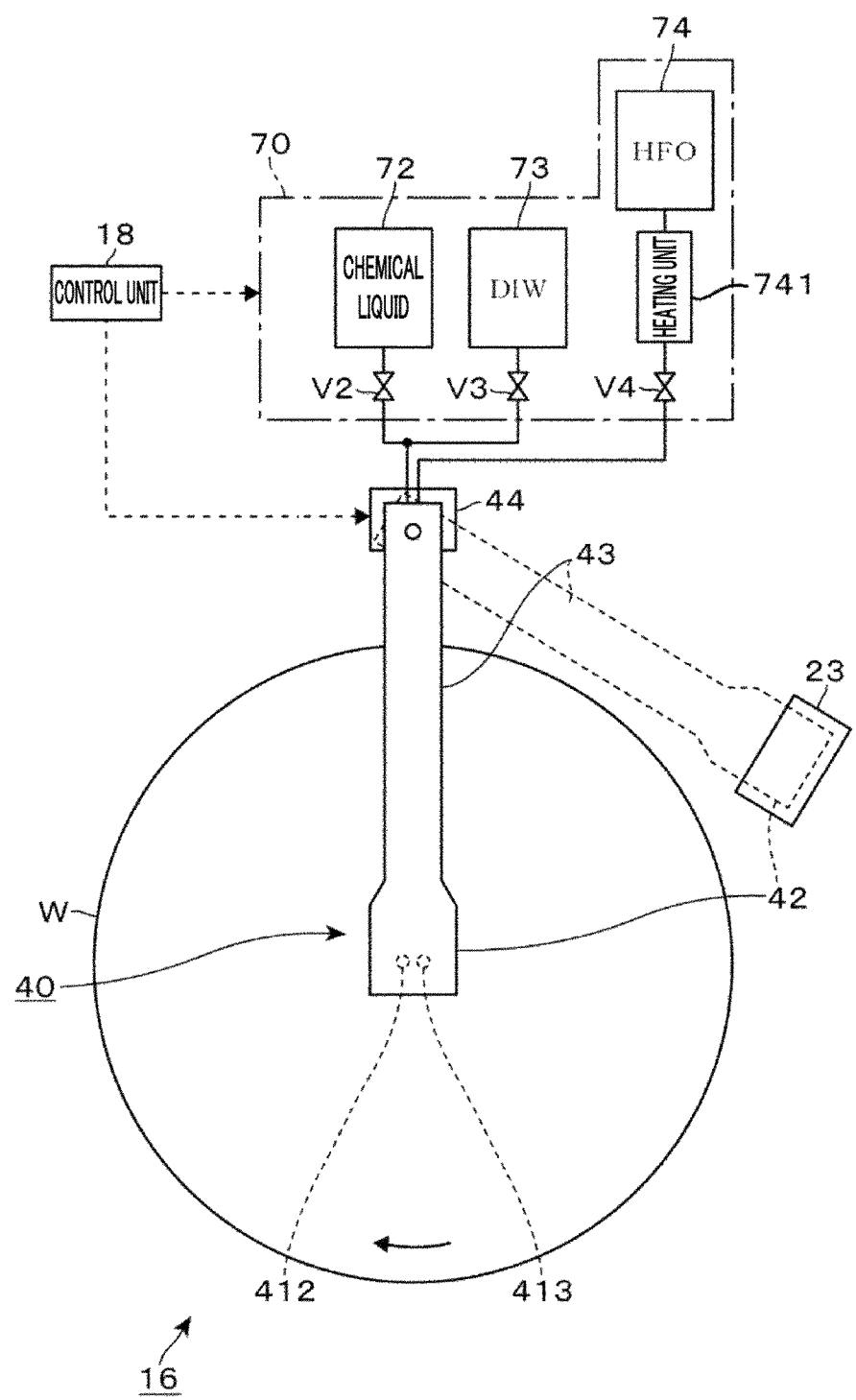
FIG. 3 is a plan view of the processing unit.

These nozzles 412 and 413 are provided at a common nozzle head 42, and the nozzle head 42 is connected via a nozzle arm 43 to a rotation driving unit 44 which is provided at a base end side of the nozzle arm 43. By rotating the nozzle arm 43 in a transversal direction through the rotation driving unit 44, the respective nozzles 412 and 413 can be moved between a processing position above a central portion of the wafer W held by the substrate holding mechanism 30 and a standby position where the nozzles 412 and 413 stand by after being retreated from above the wafer W. Provided at the standby position is a standby portion 23 in which the nozzles 412 and 413 are accommodated to stand by. In FIG. 3, the nozzle head 42 and the nozzle arm 43 placed at the processing position are marked by a solid line, and the nozzle head 42 and the nozzle arm 43 placed at the standby position are marked by a dashed line.

The chemical liquid nozzle 412 is connected to a chemical liquid supply source 72 via an opening/closing valve V2 and connected to a DIW supply source 73 via an opening/closing valve V3.

One or plural kinds of chemical liquids are supplied from the chemical liquid supply source 72 depending on the purpose of a processing on the surface of the wafer W. In the present exemplary embodiment, a single kind of chemical liquid is supplied. The chemical liquid is supplied from the chemical liquid nozzle 412 through the opening/closing valve V2

Further, the DIW is supplied from the chemical liquid nozzle 412 through the opening/closing valve V3. In the supply of the DIW, the chemical liquid nozzle 412 corresponds to a pure water supply nozzle.

The HFO nozzle 413 is connected to a HFO supply source 74 via an opening/closing valve V4. HFO is supplied from the HFO supply source 74 to replace the DIW previously supplied on the surface of the wafer W. Here, the HFO is a generic term referring to chemical substances in which a part or all of hydrogen atoms in olefin are replaced by fluorine atoms. The HFO corresponds to a solvent in the present exemplary embodiment, and the HFO nozzle 413 corresponds to a solvent supply nozzle.

In the present exemplary embodiment, as the HFO supplied to the wafer W, one having a boiling point higher than a boiling point (100° C.) of the DIW is employed. An example of the HFO having such a characteristic may be Sinera (US registered trademark of Chemours Company, having a boiling point of 110.5° C.), Suprion (US registered trademark of Chemours company, having a boiling point of 110.5° C.), or the like.

In general, a liquid has a characteristic that a surface tension decreases with a rise of a temperature thereof. For example, the Sinera, an example of the HFO, has a surface tension of 9.4 mN/m at a temperature of 100° C., which is equivalent to only ⅛ of a surface tension (72.8 mN/m) of water at a temperature of 20° C.

Further, a surface tension of IPA (IsoPropyl Alcohol, having a boiling point of 82.4° C.), which is generally used as the solvent supplied after the supply of the DIW, is just 15.4 mN/m even when it is heated to a temperature of 70° C. close to the boiling point thereof. That is, the HFO heated to a temperature equal to or higher than the boiling point of the DIW has a small surface tension. Thus, when the HFO is removed from the surface of the wafer W, a force applied to a pattern of the wafer W is also small.

In the processing unit 16 of the present exemplary embodiment, a heating unit 741 is provided downstream of the HFO supply source 74, and the HFO is heated to a temperature equal to or higher than 100° C. (boiling point of the DIW) and lower than a boiling point of the HFO, and then, the heated HFO is supplied to the surface of the wafer W from the HFO nozzle 413 in a liquid state.

A configuration of the heating unit 741 configured to heat the HFO is not particularly limited. By way of example, a heat transfer heater may be provided in a heating vessel in which the HFO to be heated flows. By heating the heating vessel through the heat transfer heater, the HFO inside the heating vessel may be heated. Alternatively, there may be employed a dielectric heating method of heating the HFO flowing in the heating vessel directly by using a coil to which a high frequency power is applied.

The heating unit 741 is configured to increase or decrease an output of the heat transfer heater or the high frequency power such that the temperature of the HFO supplied to the wafer W approaches a preset temperature (equal to or higher than 100° C. and lower than the boiling point of the HFO), based on a detection value of a non-illustrated temperature detector provided at an outlet side of the heating unit 741.

Operations of the processing unit 16 such as the movement of the nozzles 412 and 413 between the standby position and the processing position, the supply and the stop of the supply of the liquids from the respective supply sources 72 to 74, and the setting of the temperature of the HFO heated in the heating unit 741 described above with reference to FIG. 3 are controlled by the aforementioned control unit 18.

The details of the liquid processing performed by using the processing unit 16 having the above-described configuration will be discussed with reference to FIG. 4 and FIG. 5.

Figure 4:
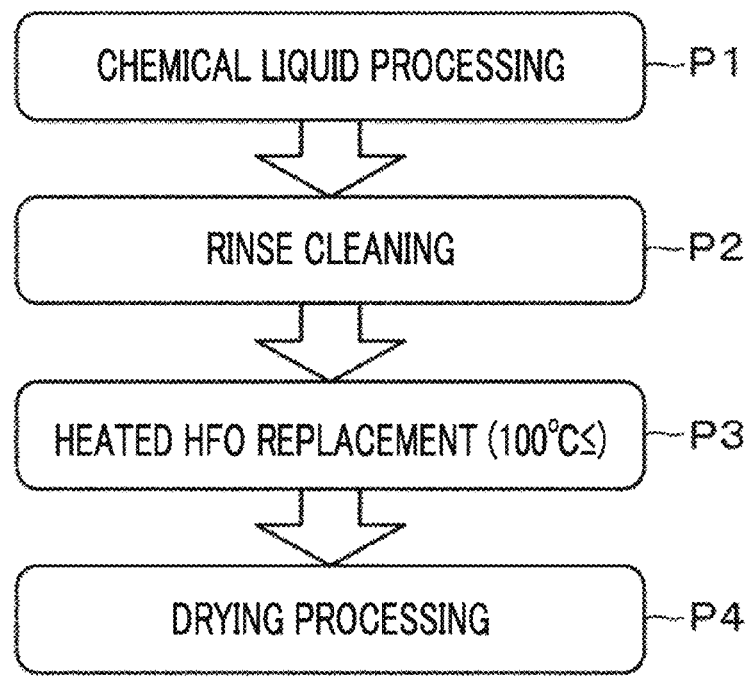
FIG. 4 is a flowchart of a liquid processing performed by the processing unit.

If a wafer W carried into the processing unit 16 by the substrate transfer device 17 is held by the substrate holding mechanism 30, the nozzle head 42 (the nozzles 412 and 413) in the standby position is moved to the processing position, and a chemical liquid is supplied from the chemical liquid nozzle 412 while rotating the wafer W at a preset rotational speed (processing P1 of FIG. 4). From this point of view, the support unit 32 and the driving unit 33 shown in FIG. 2 correspond to a rotating mechanism configured to rotate the wafer W held by the holding unit 31.

If the processing by the chemical liquid is finished, the liquid supplied from the chemical liquid nozzle 412 is changed to DIW, and a rinse cleaning is performed (processing P2 of FIG. 4, pure water supplying process). To elaborate, while rotating the wafer W, the DIW is supplied onto the wafer W on which a liquid film of the chemical liquid exists.

If the rinse cleaning is performed for a preset time period, the supply of the DIW from the chemical liquid nozzle 412 is stopped, and heated HFO is supplied from the HFO nozzle 413 onto the surface of the wafer W being rotated, so that replacement of the DIW with the HFO is begun (processing P3 of FIG. 4, heated solvent supplying process).

Here, there is a likelihood that the HFO which has not yet reached the HFO nozzle 413 in a previous supply of the HFO may remain at a downstream side of the heating unit 741, and a temperature of the HFO is lowered thereat. Accordingly, there may be set up a configuration in which the HFO with the lowered temperature is drained out to be collected into a non-illustrated collection line, and heating of the HFO is begun while the HFO is being drained into the collection line. In such a configuration, if a flow path of the HFO is switched to the HFO nozzle 413, it is possible to supply the HFO heated to a preset temperature onto the surface of the wafer W rapidly.

Figure 5:
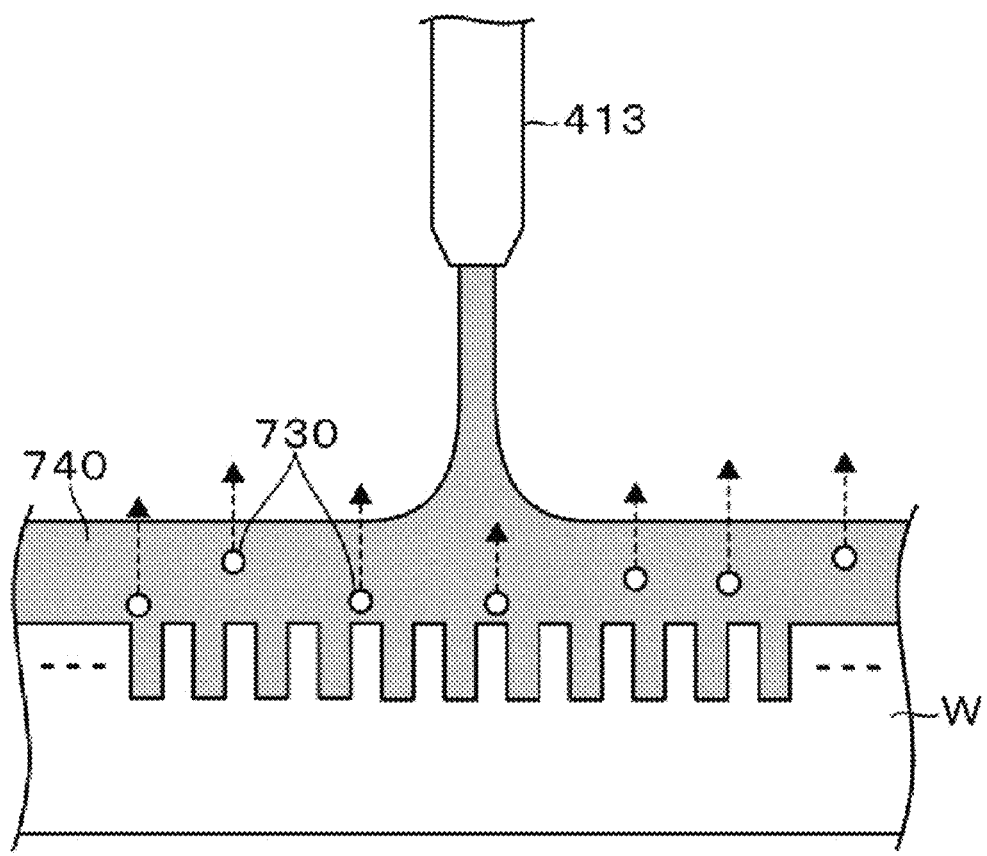
FIG. 5 is a diagram schematically illustrating a surface of a wafer on which a heated solvent is supplied.

As depicted in FIG. 5, the HFO supplied from the HFO nozzle 413 is diffused onto the surface of the wafer W being rotated, so that the DIW is replaced. At this time, as solubility of the DIW with respect to a HFO 740 is low, there may be formed, on the surface of the wafer W, a region where the DIW remains without being replaced with the HFO 740. In such a case, since the HFO heated to the temperature equal to or higher than the boiling point of the DIW is continuously supplied, the DIW remaining on the surface of the wafer W may be heated by the HFO 740 to be evaporated into, for example, a vapor 730 and to be exhausted to the outside from a liquid film of the HFO 740.

Particularly, the DIW introduced into a pattern formed on the surface of the wafer W may be difficult to replace with the HFO 740 having the low solubility for water. However, by heating the DIW by the HFO 740 and turning it into the vapor 730, the exhaust of the DIW from the inside of the pattern can be eased. Furthermore, since the pattern formed on the surface of the wafer W is very small, by supplying a sufficient caloric power through the HFO 740, the DIW can be changed into the vapor 730 from the liquid state while hardly forming a gas-liquid interface of the DIW or while minimizing a time period during which the gas-liquid interface is formed. The HFO 740 having a larger specific gravity than the vapor 730 enters the inside of the pattern from which the vapor 730 is removed.

After the DIW on the surface of the wafer W is replaced by the HFO 740 sufficiently, the supply of the HFO from the HFO nozzle 413 is stopped. Then, by removing the HFO while rotating the wafer W, a drying processing of the wafer W is performed (processing P4 of FIG. 4, removing process).

As stated above, since the HFO 740 heated to 100° C. or higher has a surface tension much smaller than that of the DIW, it is possible to dry the wafer W while suppressing a pattern collapse. Further, the HFO 740 may have a surface tension smaller than that of water at a room temperature (for example, the aforementioned Sinera has a surface tension of 16.8 mN/m at 25° C.). Accordingly, after the DIW remaining on the surface of the wafer W is replaced by the HFO 740, as long as the surface tension of the HFO 740 is smaller than that of the water, the temperature of the HFO 740 during the drying processing may get lower than 100° C.

After the supply of the HFO from the HFO nozzle 413 is stopped, if the HFO on the surface of the wafer W is sufficiently removed by performing the drying processing of the wafer W for a preset time period, rotation of the wafer W is stopped and the liquid processing upon the wafer W is ended. Then, the wafer W is carried out of the processing unit 16 in the reverse order as it is carried in.

According to the present exemplary embodiment, the following effects can be achieved. Since the HFO in the liquid state (of the temperature equal to or lower than the boiling point of the HFO) is supplied onto the surface of the wafer W on which the DIW is previously supplied, the DIW can be washed away by the HFO. Further, since the HFO heated to the temperature equal to or higher than the boiling point of the DIW is supplied, the DIW can be removed from the surface of the wafer W by being vaporized by the heat of the HFO. As stated above, by supplying the HFO heated to the temperature equal to or higher than the boiling point of the DIW in the liquid state, the DIW existing within the pattern of the wafer W can be rapidly replaced by the HFO.

Furthermore, since the DIW does not remain within the pattern of the wafer W in the drying processing, the pattern collapse can be suppressed. In addition, since the heated HFO has a smaller surface tension than the DIW and the IPA, the pattern collapse can be further suppressed.

Figure 6:
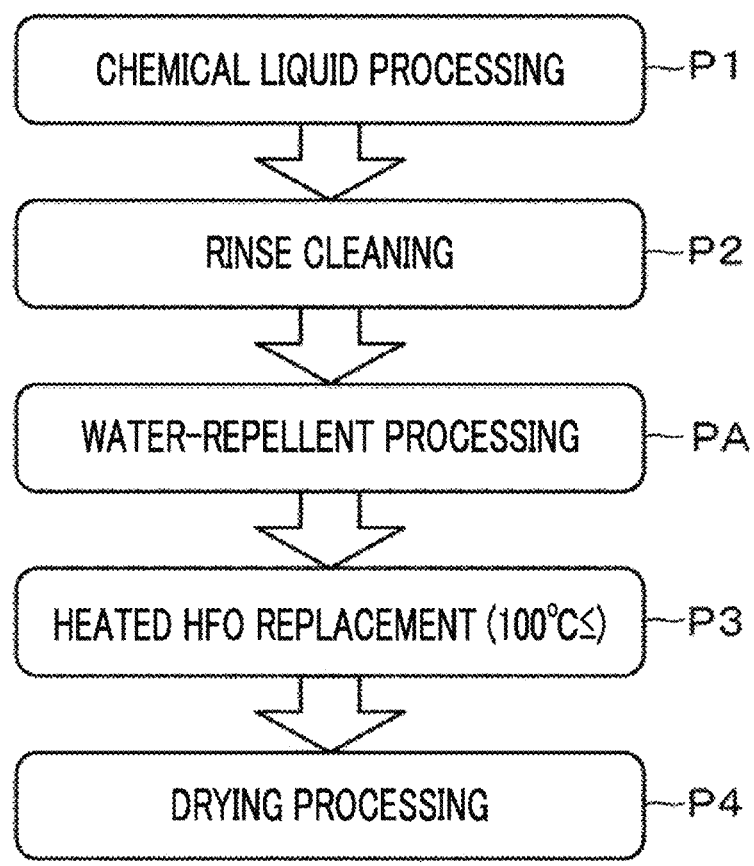
FIG. 6 is a flowchart of a liquid processing according to another exemplary embodiment.

The supply of the heated HFO is not limited to being performed immediately after the rinse cleaning by the DIW. By way of example, as shown in FIG. 6, the supply of the heated HFO may also be applied to a case of performing a supply of a water-repellent agent for treating the surface of the wafer W to have water repellency (processing PA, water-repellent agent supplying process) between the rinse cleaning (processing P2) with the DIW and the supply of the heated HFO (processing P3).

In general, the water-repellent agent is non-soluble in the DIW and is not mixed with the DIW. Therefore, even if the water-repellent agent is supplied onto the surface of the wafer W covered with the DIW, it may be difficult for the water-repellent agent to replace the DIW. Further, depending on the kind of the water-repellent agent, it may react with water, so that the water repellency is deteriorated.

If, however, the HFO heated to a temperature equal to or higher than the boiling point of the DIW is supplied after the supply of the water-repellent agent, the DIW can be vaporized through the mechanism described above with reference to FIG. 5 and can be removed as the vapor 730 from the surface of the wafer W even when the region where the DIW still remains on the surface of the wafer W is formed since the DIW is not sufficiently replaced by the water-repellent agent.

In case of supplying the water-repellent agent to the wafer W, a water-repellent agent supply unit may be provided in, for example, the processing unit 16 described above with reference to FIG. 3. Further, like the supply units 72 to 74 for the processing liquids, a water-repellent agent nozzle (water-repellent agent supply nozzle) is provided at the nozzle head 42 of the processing fluid supply unit 40. For example, there may be adopted a configuration in which the water-repellent agent supply unit and the water-repellent agent nozzle are connected via a pipeline equipped with an opening/closing valve, and so forth (the water-repellent agent supply unit, the water-repellent agent nozzle and the opening/closing valve are not shown).

The water-repellent agent for allowing the surface of the wafer W to have water repellency while reducing a surface tension applied to the pattern formed on the surface of the wafer W is supplied from the water-repellent agent supply unit. Such a water-repellent agent may be, by way of non-limiting example, trimethylsilyldimethylamine (TMS-DMA), hexamethyldisilazane (HMDS), trimethylsilyldiethylamine (TMSDEA), dimethylsilyldimethylamine (DMS-DMA), 1,1,3,3-tetramethyldisilazane (TMDS), or the like.

As depicted in FIG. 6, following the rinse cleaning by the DIW (processing P2), a water-repellent processing (processing PA) of the wafer W is performed by supplying the water-repellent agent onto the surface of the wafer W being rotated from the water-repellent agent nozzle. After the water-repellent processing is performed for a preset time period, the supply of the water-repellent agent from the water-repellent agent nozzle is stopped, and the supply of the heated HFO from the HFO nozzle 413 onto the surface of the wafer W being rotated is begun (processing P3 of FIG. 6).

At this time, since the water-repellent agent is soluble in a fluorine-containing solvent such as the HFO, the water-repellent agent remaining on the surface of the wafer W is dissolved in the HFO and falls off the wafer W after flowing on the surface of the wafer W being rotated. Meanwhile, even in case that the DIW, which is not replaced by the water-repellent agent, remains on the surface of the wafer W, this DIW is heated by the HFO heated to the temperature equal to or higher than the boiling point of the DIW, so that this DIW can be removed from the surface of the wafer W by being vaporized into the vapor 730 (FIG. 5).

Since the processings after the drying processing (processing P4 of FIG. 5) of the wafer W are the same as described above with reference to FIG. 4, redundant description will be omitted here.

In the following, there will be discussed a case of reducing a risk of the pattern collapse on the surface of the wafer W when performing the drying processing (HFO removing process) P4 for the wafer W in performing the heated HFO replacement (heated solvent supplying process) by supplying the heated HFO. In the present exemplary embodiment, after the heated HFO replacement processing (processing P3) is performed by supplying the heated HFO onto the central portion of the wafer W being rotated, the supply position of the HFO from the HFO nozzle 413 is moved from the central portion side of the wafer W being rotated toward the peripheral portion side thereof, so that the HFO is removed from the surface of the wafer W (drying processing P4).

Figure 7:
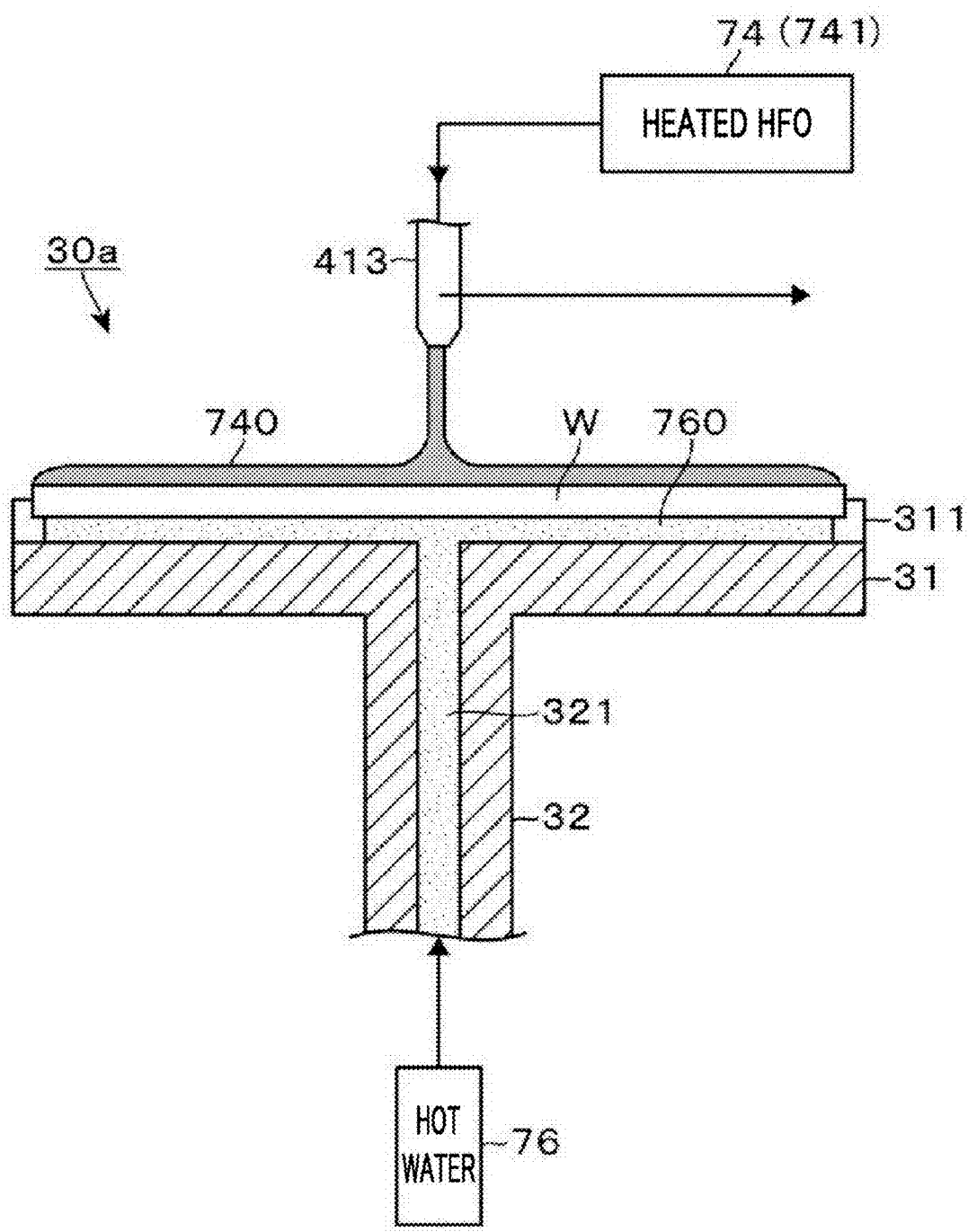
FIG. 7 is a configuration view of a processing unit equipped with a rear surface heating mechanism.

In this case, as illustrated in FIG. 7, the supply of the HFO is performed by using a supply mechanism including the processing fluid supply unit 40 (HFO nozzle 413), the HFO supply source 74, the heating unit 741, and so forth, shown in FIG. 2 and FIG. 3. In a substrate holding mechanism 30a of the present exemplary embodiment, the wafer W is held by a plurality of supporting pins 311 provided at the holding unit 31, and a gap is formed between a top surface of the holding unit 31 and a rear surface of the wafer W.

Further, a hot water path 321 through which a heating fluid is supplied toward the gap from below the central portion of the wafer W is formed in the support unit 32 and the holding unit 31. A hot water supply source 76 configured to supply hot DIW 760 as the heating fluid heated to a temperature lower than the boiling point (100° C.) thereof, desirably, equal to or higher than 50° C., e.g., 75° C. is connected to an upstream side of the hot water path 321. This hot water is supplied while heated to a temperature lower than the liquid temperature of the HFO.

If the hot water is supplied from the hot water path 321 while rotating the wafer W by rotating the support unit 32, the hot water is diffused within the gap, so that it is possible to supply the hot water on the entire rear surface of the wafer W.

Heating of the wafer W by the hot water is performed to reduce the risk of the pattern collapse on the surface of the wafer W when performing the drying processing (HFO removing process) P4 for the wafer W after performing the heated HFO replacement processing P3 by the heated HFO.

As stated above, in the present exemplary embodiment, after conducting the heated HFO replacement processing P3 by supplying the heated HFO to the central portion of the wafer W being rotated, the supply position of the HFO from the HFO nozzle 413 is moved from the central portion side of the wafer W being rotated toward the peripheral portion side thereof, so that the HFO is removed from the surface of the wafer W (drying processing P4).

First, it is assumed that no temperature adjustment is performed on the wafer W when moving the supply position of the HFO from the central portion side of the wafer W toward the peripheral portion side thereof after performing the replacement processing of the DIW by supplying the heated HFO (in case of performing the water-repellent processing (processing PA) as in the example shown in FIG. 6, after performing the replacement processing of the water-repellent agent). If this corresponding method is used, it is found out that the risk of the pattern collapse tends to increase gradually from the central portion side within the surface of the wafer W toward the peripheral portion side thereof.

When supplying the heated HFO while rotating the wafer W, a velocity in a tangent direction at each position on the surface of the wafer W increases and a supply amount of the heated HFO per a unit area decreases as it goes toward the peripheral portion of the wafer W. As a result, an influence of air cooling of the HFO by the ambient atmosphere around the wafer W may be increased, so that a range of a temperature decrease of the HFO is increased, so that the surface tension is increased. The risk of the pattern collapse is deemed to be increased as it goes toward the peripheral portion of the wafer W for this reason.

In view of the foregoing problem, the substrate holding mechanism 30a of the present exemplary embodiment is equipped with a rear surface heating mechanism configured to suppress, by supplying the hot water to the rear surface side of the wafer W from the hot water path 321, a temperature decrease of the wafer W that might occur when removing the HFO while moving the supply position of the HFO to prevent the occurrence of the pattern collapse.

In the substrate holding mechanism 30a equipped with the mechanism configured to supply the hot water to the rear surface side of the wafer W as stated above, the hot water may be supplied to the rear surface side of the wafer W for the whole time period during which the HFO is removed while the supply position of the HFO is moved. If the hot water is supplied for the whole time period during which the HFO is removed, the risk of the pattern collapse at the peripheral portion side of the wafer W can be reduced, as compared to the case where the hot water is not supplied.

Figure 9:
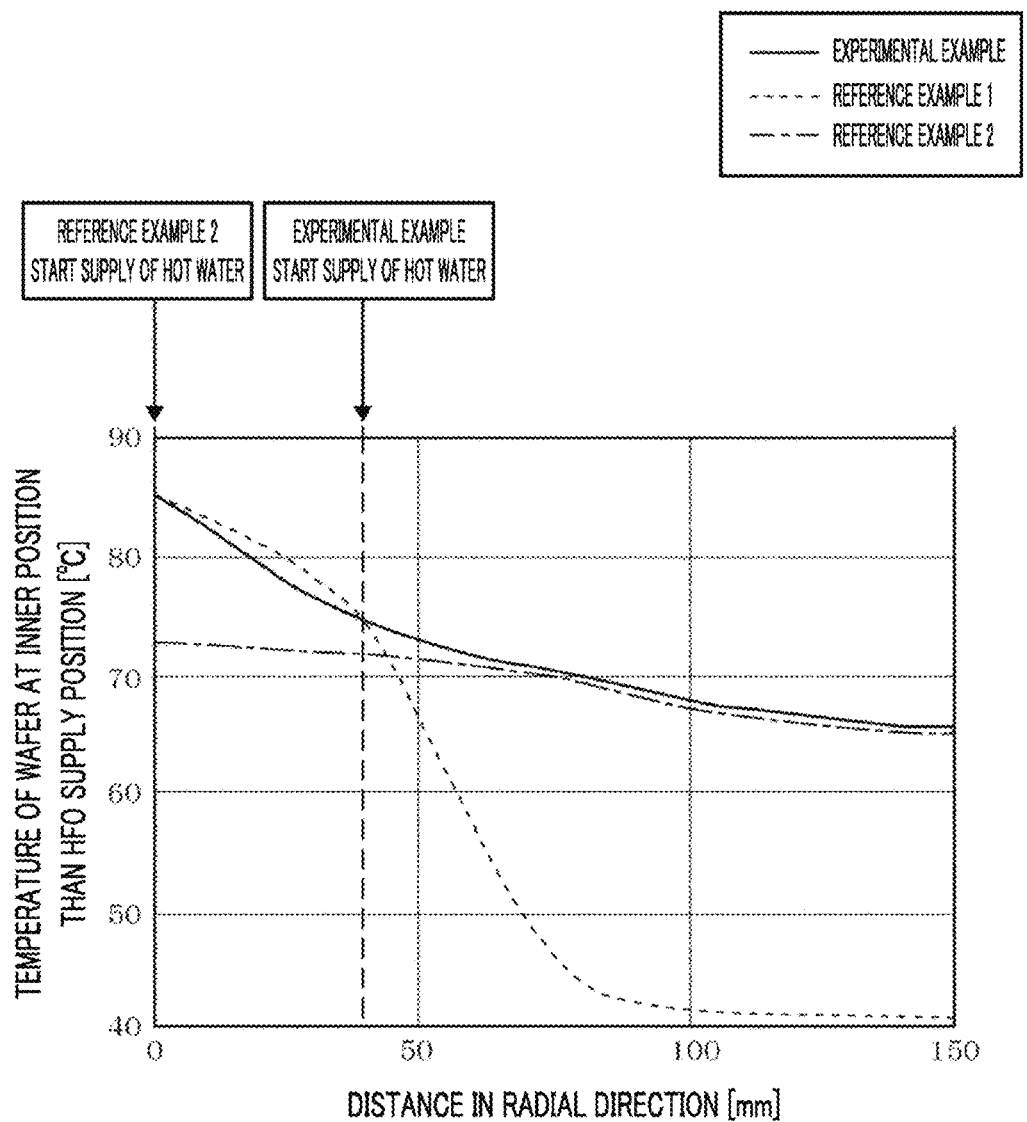
FIG. 9 presents an experimental result showing a temperature variation of a drying interface when supplying the heated HFO.

Meanwhile, it is found out that if the hot water is constantly supplied as stated above, the temperature of the central portion side of the wafer W declines as compared to the case where the hot water is not supplied (FIG. 9). A lower temperature leads to the higher risk of the pattern collapse. However, it is apparent that regardless of whether or not the hot water is supplied to the rear surface side of the wafer W, a number of the occurrence of the pattern collapse can be reduced by supplying the heated HFO, as compared to the case where the HFO is not heated.

As for a reason for the temperature decrease of the central portion of the wafer W, it may be deemed that the hot water cools the heated HFO in case that a temperature of the hot water supplied to the rear surface of the wafer W is lower than the temperature of the heated HFO. That is, from the viewpoint of suppressing the DIW from being boiled or for the reason of restrictions in devices, the hot water is supplied at a temperature of, e.g., 75° C. lower than the boiling point thereof. In contrast, if the heated HFO is supplied at a temperature higher than the hot water, the HFO on the wafer W may be cooled by the hot water, which is supplied to the rear surface side thereof, in a region where the HFO supplied to the wafer W is maintained at a relatively high temperature, that is, in a central region of the wafer W. In such a case, if the influence of the cooling of the HFO by the hot water is increased, the surface tension of the HFO may be increased, so that the risk of the pattern collapse is relatively increased in the central portion side of the wafer W.

On the ground of the above-stated phenomena, the processing unit 16 equipped with the substrate holding mechanism 30a of the present exemplary embodiment is capable of reducing the surface tension caused by the supply of the heated HFO by starting the supply of the hot water to the rear surface of the wafer W at an appropriate timing A processing performed on the wafer W by using the above-described substrate holding mechanism 30a will be explained with reference to FIG. 8A to FIG. 8D. In FIG. 8A to FIG. 8D, illustration of the holding unit 31 and the support unit 32 is omitted for the simplicity of illustration.

Figure 8A:
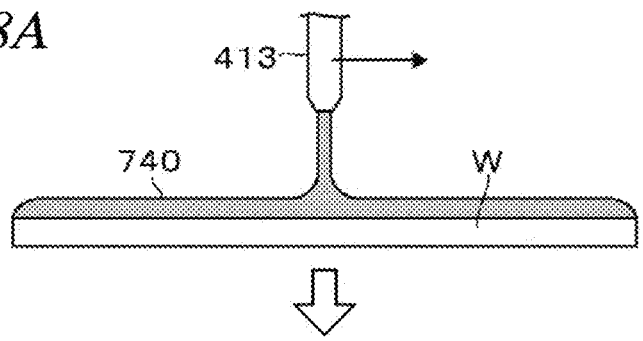
FIG. 8A to 8D are diagrams illustrating a wafer processing through a supply of heated HFO in combination with a rear surface heating.

The HFO nozzle 413 is placed above the central portion of the wafer W, and the heated HFO is supplied onto the surface of the wafer W on which the DIW is previously supplied, so that the processing of replacing the DIW with the HFO (heated HFO replacement processing P3 of FIG. 4) is performed. After this heated HFO replacement processing is performed for a preset time period, the removal of the HFO (drying processing P4) is begun by moving the HFO nozzle 413 from the central portion side of the wafer W toward the peripheral portion side thereof (FIG. 8A).

If the HFO nozzle 413 is being moved, a residual liquid film 740a having a thinner thickness than a liquid film (HFO 740 in FIG. 8A to FIG. 8D) formed at an outer side than the supply position of HFO 740 is formed at the central region of the wafer W where a centrifugal force applied to the HFO 740 is relatively small. If the hot water having a temperature lower than that of the heated HFO is supplied to the rear surface of the wafer W when the corresponding residual liquid film 740a exists, the temperature of the HFO forming the residual liquid film 740a is decreased, resulting in the increase of the surface tension thereof. As a consequence, the pattern collapse may be easily caused when the HFO is vaporized.

Figure 8B:
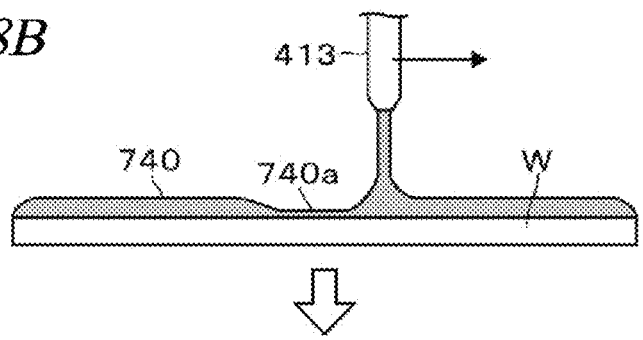

Accordingly, in a time period during which the residual liquid film 740*a* of the HFO is formed at the central region of the wafer W, the supply of the hot water to the rear surface side of the wafer W is not begun until the residual liquid film 740*a* disappears on the wafer W by the centrifugal force and the volatilization (FIG. 8B). Here, "disappearing of the residual liquid film 740*a*" implies a state where the residual liquid film 740*a* is not seen when the wafer W being rotated is observed with naked eyes while moving the supply position of the HFO.

Here, it is desirable that a moving velocity of the HFO nozzle 413 moved from the central portion side of the wafer W toward the peripheral portion side thereof is set to a value which allows the HFO nozzle 413 not to reach the peripheral portion of the wafer W at a time when the residual liquid film 740*a* volatilizes. If the moving velocity of the HFO nozzle 413 is set to be excessively high, the HFO nozzle 413 reaches the peripheral portion of the wafer W before the supply of the hot water to the rear surface side of the wafer W is begun, which may result in the increase of the risk of the pattern collapse at the peripheral portion of the wafer W. To be more specific, it is desirable to set the moving velocity of the HFO nozzle 413 such that the HFO nozzle 413 is located at an inner position than a position corresponding to ½ of a radius of the wafer W at the time when the residual liquid film 740*a* at the central region disappears from the wafer W. Further, the moving velocity of the HFO nozzle 413 may not be maintained constant on the moving path of the HFO nozzle 413 moved from the central portion side of the wafer W toward the peripheral portion side thereof, but may be changed during this movement.

Figure 8C:
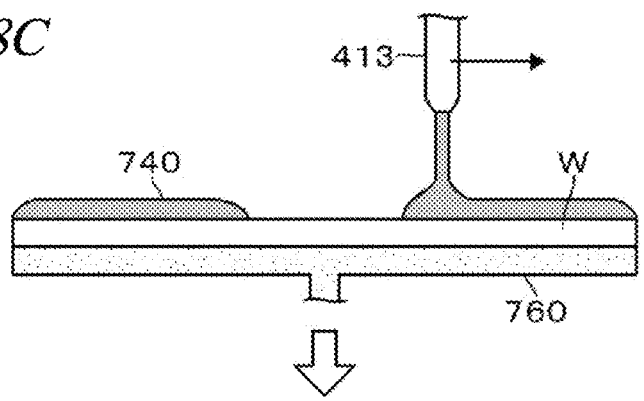

Further, the supply of the hot water to the rear surface of the wafer W from the hot water path 321 is begun at a time when the residual liquid film 740*a* at the central region, in which the HFO is not supplied, disappears from the wafer W (FIG. 8C). If the moving velocity of the HFO nozzle 413 is maintained constant for individual wafers W (if a changing process of the moving velocity is same for the individual wafers W when the moving velocity of the HFO nozzle 413 is changed) and processing conditions such as a discharge rate of the HFO 740 from the HFO nozzle 413 and a rotational speed of the wafer W are satisfied, the position of the HFO nozzle 413 on the moving path from the central portion side of the wafer W toward the peripheral portion side thereof at the time when the residual liquid film 740*a* disappears from the wafer W gets approximately same even when processing the different wafers W.

In this regard, in the processing unit 16 of the present exemplary embodiment, the time when the residual liquid film 740*a* at the central region of the wafer W disappears from the wafer W and the position of the HFO nozzle 413 on the moving path at that time are previously investigated through a preliminary experiment or the like. When processing each wafer W, the supply of the hot water to the rear surface of the wafer W is begun, based on this correspondence, at a time when the HFO nozzle 413 reaches a preset position on the moving path.

Figure 8D:
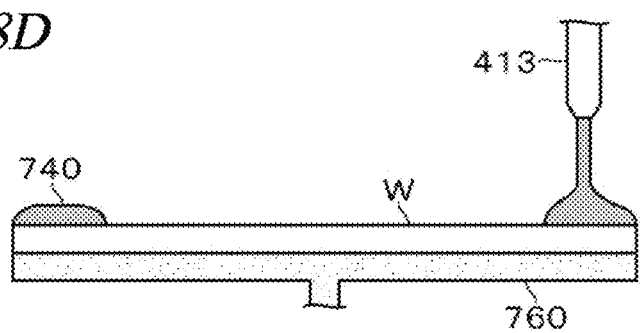

After the supply of the hot water to the rear surface of the wafer W is begun, the HFO nozzle 413 is still moved toward the peripheral portion of the wafer W along the moving path while discharging the HFO (see FIG. 8D). At the peripheral portion of the wafer W, the temperature decrease of the HFO caused by the influence of the air cooling is mitigated due to the supply of the hot water, and the increase of the surface tension of the HFO is suppressed. Therefore, the occurrence of the pattern collapse can be suppressed.

After the HFO nozzle 413 arrives at the peripheral portion of the wafer W, the supply of the HFO from the HFO nozzle 413 and the supply of the hot water from the hot water path 321 are stopped. In the meanwhile, by continuing the rotation of the wafer W, the HFO and the hot water remaining on the wafer W is scattered. After the remaining HFO and hot water are scattered, the rotation of the wafer W is stopped.

Here, the heating fluid supplied to the rear surface of the wafer W is not limited to the hot water. By way of non-limiting example, the heated HFO may be used, or the temperature decrease of the wafer W can be suppressed by using a heated gas, e.g., heated clean air.

In the various exemplary embodiments described above, the solvent supplied to the wafer W in the liquid state while being heated to 100° C. or higher may not be limited to the HFO, but may be HFE, HFC or PFC (Perfluoro Carbon). As an example of the HFE which is a fluorine-containing solvent prepared by substituting a part of hydrogen atoms of hydrocarbon having an ether linkage in the molecule with fluorine, Novec (registered trademark of Sumitomo 3M Ltd.) 7500 (having a boiling point of 128° C.) may be used. Further, as an example of the HFC which is a fluorine-containing solvent prepared by substituting a part of hydrogen atoms of hydrocarbon with fluorine, ASAHIKLIN (registered trademark of Asahi Glass Co., Ltd.) AC-6000 (having a boiling point of 115° C.) may be used. Furthermore, as an example of a fluorine-containing solvent prepared by substituting all of hydrogen atoms of hydrocarbon with fluorine, Fluorinert (registered trademark of Sumitomo 3M Ltd.) FC40 (having a boiling point of 165° C.) may be used.

Besides, the solvent supplied to the wafer W in the liquid state while being heated to 100° C. or higher may not be limited to the fluorine-containing solvent. An organic solvent without containing fluorine, for example, ethyl lactate (having a boiling point of 155° C.) may be used.

EXAMPLES

Experiments

When removing the HFO while moving the supply position of the HFO from the central portion side of the wafer W toward the peripheral portion side thereof, a variation of the surface temperature of the wafer W is observed while varying a supply condition of the hot water to the rear surface of the wafer W.

A. Conditions for Experiments

After performing the water-repellent processing by using the water-repellent agent with respect to the wafer W being rotated (processing PA of FIG. 6), the HFO replacement processing (processing P3 of FIG. 6) is performed by supplying the HFO heated to 100° C. Subsequently, the drying processing (processing P4 of FIG. 6) is performed by moving the supply position of the HFO from the central portion side of the wafer W toward the peripheral portion side thereof.

Experimental Example

When performing the drying processing P4, the supply of the hot water heated to 75° C. to the rear surface of the wafer W is begun at a time when the HFO nozzle 413 reaches a position of 40 mm from a center of the wafer W. In this case, a temperature variation of the wafer W at an inner position spaced apart from the supply position of the HFO by a preset distance is measured. At this time, the residual liquid film 740a is found to substantially disappear at a time when the HFO nozzle 413 reaches the position of 40 mm from the center of the wafer W. Here, the "inner position" refers to a position spaced by about several millimeters (mm) inwardly in a radial direction of the wafer W from a position where the HFO discharged from the HFO nozzle 413 reaches the surface of the wafer W, and corresponds to a position of an interface between the surface of the dried wafer W and the HFO 740 after the residual liquid film 740a is vaporized.

Reference Example 1

A temperature variation of the wafer W is measured under the same conditions as those of the experimental example excepting that the hot water is not supplied to the rear surface of the wafer W.

Reference Example 2

A temperature variation of the wafer W is measured under the same conditions as those of the experimental example excepting that the hot water is constantly applied to the rear surface of the wafer W for a time period during which the HFO nozzle 413 is moved.

B. Experimental Results

The temperature variations at the inner position than the supply position of the HFO in the experimental example and the reference examples 1 and 2 are shown in FIG. 9. A horizontal axis of FIG. 9 represents a distance from the center of the wafer W in the radial direction, and a vertical axis of FIG. 9 indicates a temperature at the inner position at a time after the movement of the HFO nozzle 413 is begun. A tendency of the temperature variation in the experimental example is indicated by a solid line, and tendencies of the reference examples 1 and 2 are indicated by a dashed line and a dashed dotted line, respectively.

As can be seen from FIG. 9, in the experimental example, the temperature at the inner position than the supply position of the HFO is at its highest of about 85° C. at the central portion of the wafer W and gradually declines as the HFO nozzle 413 is moved toward the peripheral portion thereof. When the HFO nozzle 413 reaches an edge of the wafer W, the temperature at the inner position is at its lowest of about 65° C.

In contrast, in the reference example 1 where the hot water is not supplied, though the tendency of the temperature variation at the central region of the wafer W is substantially the same as that of the experimental example, the temperature at the inner position is found to be reduced rapidly after the HFO nozzle 413 reaches the position apart from the center of the wafer W by about 40 mm. When the HFO nozzle 413 reaches the edge of the wafer W, the temperature at the inner position is found to be reduced to about 40° C. Meanwhile, in the reference example 2 where the hot water is constantly supplied to the rear surface of the wafer W, the tendency of the temperature variation is found to be substantially the same as that of the experimental example after the HFO nozzle 413 reaches a position spaced apart from the center of the wafer W by about 65 mm. At the central region of the wafer W, on the other hand, the temperature at the inner position is found to be reduced sharply since the hot water having a lower temperature (75° C.) than the HFO (100° C.) is supplied.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

We claim:

1. A liquid processing method of supplying pure water onto a substrate, which is horizontally held and has a pattern formed on a surface thereof, and drying the substrate, the liquid processing method comprising:
   a pure water supplying process of supplying the pure water onto the surface of the substrate;
   a heated solvent supplying process comprising:
      heating a solvent to a temperature that is equal to or higher than a boiling point of water;
      after the pure water supplying process, supplying the heated solvent onto the surface of the substrate on which the pure water exists,
      wherein the pure water is vaporized from the surface of the substrate by the heat of the heated solvent; and
   a removing process of drying the substrate by removing the solvent form the surface of the substrate,
   wherein the solvent has a boiling point higher than a boiling point of the pure water.

2. The liquid processing method of claim 1,
   wherein, in the heated solvent supplying process, the pure water on the surface of the substrate is replaced with the heated solvent while being scattered by a centrifugal force caused by rotating the substrate around a vertical axis.

3. The liquid processing method of claim 1,
   wherein, in the heated solvent supplying process, the pure water on the surface of the substrate is replaced with the heated solvent while being vaporized.

4. The liquid processing method of claim 1, further comprising:
   a water-repellent agent supplying process of supplying, following the pure water supplying process, a water-repellent agent allowing the surface of the substrate to be the water-repellent onto the surface of the substrate,
   wherein the heated solvent supplying process is performed in a state that the pure water remains on the surface of the substrate after the water-repellent agent supplying process.

5. The liquid processing method of claim 1,
   wherein the solvent is a fluorine-containing solvent.

6. The liquid processing method of claim 1,
   wherein, in the heated solvent supplying process, the heated solvent is supplied onto a central portion of the substrate while rotating the substrate around a vertical axis which passes through the central portion of the substrate,
   in the removing process, a supply position of the heated solvent is moved from a central portion side of the substrate being rotate toward a peripheral portion side thereof, and
   a heating fluid is supplied to a rear surface of the substrate being rotated after a preset time, while the supply position of the heated solvent moves on a path from the central portion side toward the peripheral portion side.

7. The liquid processing method of claim 6,
wherein the preset time corresponds to a time when a liquid film of the heated solvent disappears at the central portion of the substrate after the supply position of the heated solvent is moved from the central portion.

8. The liquid processing method of claim 6,
wherein the heating fluid is pure water heated to a temperature equal to or higher than 50° C. and lower than a boiling point thereof.

9. A liquid processing method comprising:
supplying pure water onto a surface of a substrate;
heating a solvent to a temperature that is equal to or higher than a boiling point of the pure water and lower than a boiling point of the solvent;
supplying the heated solvent onto the surface of the substrate on which the pure water exists such that the pure water is removed from the surface of the wafer by being vaporized by the heat of the heated solvent; and
drying the substrate by removing the solvent form the surface of the substrate.

* * * * *